(12) United States Patent
Oropesa-Nuñez et al.

(10) Patent No.: US 12,148,546 B2
(45) Date of Patent: Nov. 19, 2024

(54) ELECTRICALLY AND/OR MAGNETICALLY ACTIVE MATERIAL AND PRODUCTION METHOD THEREOF

(71) Applicants: BEDIMENSIONAL S.P.A., Genoa (IT); FONDAZIONE ISTITUTO ITALIANO DI TECNOLOGIA, Genoa (IT)

(72) Inventors: Reinier Oropesa-Nuñez, Genoa (IT); Sebastiano Bellani, Genoa (IT); Leyla Najafi, Genoa (IT); Andrea Gamucci, Genoa (IT); Vittorio Pellegrini, Genoa (IT); Francesco Bonaccorso, Genoa (IT)

( * ) Notice: Subject to any disclaimer, the term of this patent is extended or adjusted under 35 U.S.C. 154(b) by 0 days.

(21) Appl. No.: 17/616,672

(22) PCT Filed: Jun. 11, 2020

(86) PCT No.: PCT/IB2020/055477
§ 371 (c)(1),
(2) Date: Dec. 5, 2021

(87) PCT Pub. No.: WO2020/250165
PCT Pub. Date: Dec. 17, 2020

(65) Prior Publication Data
US 2022/0172860 A1 Jun. 2, 2022

(30) Foreign Application Priority Data
Jun. 11, 2019 (IT) .................. 102019000008592

(51) Int. Cl.
*H01B 1/22* (2006.01)
*C08K 3/04* (2006.01)
(Continued)

(52) U.S. Cl.
CPC ............... *H01B 1/22* (2013.01); *H01B 1/24* (2013.01); *H01B 5/16* (2013.01); *H01F 1/032* (2013.01);
(Continued)

(58) Field of Classification Search
None
See application file for complete search history.

(56) References Cited

U.S. PATENT DOCUMENTS

2007/0265379 A1* 11/2007 Chen .................. C08K 7/24
524/495
2013/0037094 A1* 2/2013 Wang ................. H01L 31/056
252/514

(Continued)

FOREIGN PATENT DOCUMENTS

WO 2017007568 1/2017

OTHER PUBLICATIONS

Castro J et al, "Synthesis and characterization of low-loss Fe3O4-PDMS magneto-dielectric polymer nanocomposites for RF applications", WAMICON 2014, IEEE,Jun. 6, 2014 (Jun. 6, 2014), p. 1-5.

(Continued)

*Primary Examiner* — Katie L. Hammer
(74) *Attorney, Agent, or Firm* — Themis Law

(57) ABSTRACT

A method of formulating and using pastes, inks or adhesives made of electrically conductive and magnetically polarizable materials bound by a polymeric matrix includes depositing a paste, ink or adhesive at a low temperature, and using the paste, ink or adhesive as an electrically and magnetically and thermally active component, either in a wet or dried state. The polymer matrix provides the deposited product with mechanical properties, which integrate with the electrical and magnetic functions expressed by the other mate- (Continued)

rials in the product. The product can be deposited both on a flexible and a rigid substrate, and can be used directly on the substrate, or in a form released from the substrate. The deposited product may be used as an electromagnetic and thermal component and device, such as an electromagnetic welder, electromagnetic heater, multifunctional material and coating passivating a static electric charge, magnetoresistive sensor, electromechanical relay, or electromechanical actuator.

18 Claims, 6 Drawing Sheets

(51) Int. Cl.
*C08K 3/22* (2006.01)
*H01B 1/24* (2006.01)
*H01B 5/16* (2006.01)
*H01F 1/032* (2006.01)
*H01F 1/12* (2006.01)
*H10K 30/82* (2023.01)
*H10N 50/85* (2023.01)

(52) U.S. Cl.
CPC ............... *H01F 1/12* (2013.01); *H10K 30/82* (2023.02); *H10N 50/85* (2023.02); *C08K 3/042* (2017.05); *C08K 2003/2275* (2013.01); *C08K 2201/001* (2013.01); *C08K 2201/01* (2013.01)

(56) References Cited

U.S. PATENT DOCUMENTS

2016/0360616 A1* 12/2016 Zhamu ................ H05K 1/0259
2017/0158815 A1    6/2017 Hu

OTHER PUBLICATIONS

Ali Maleki, Maryam Niksefat, Jamal Rahimi and Zoleikha Hajizadeh, "Design and preparation of Fe3O4@PVA polymeric magnetic nanocompositeflm and surface coating by sulfonic acidvia in situ methods and evaluation of itscatalytic performance in the synthesisof dihydropyrimidines", BMC Chemistry, vol. 13, No. 19, Feb. 4, 2019 (Feb. 4, 2019), p. 1-13.

A. M. El Sayed, W. M. Morsi, "a-Fe2O3 / (PVA+PEG) Nanocomposite films; synthesis, optical,and dielectric characterizations", J Mater Sci,vol. 49, Apr. 24, 2014 (Apr. 24, 2014), p. 5378-538,.

* cited by examiner

Electromchanical relays
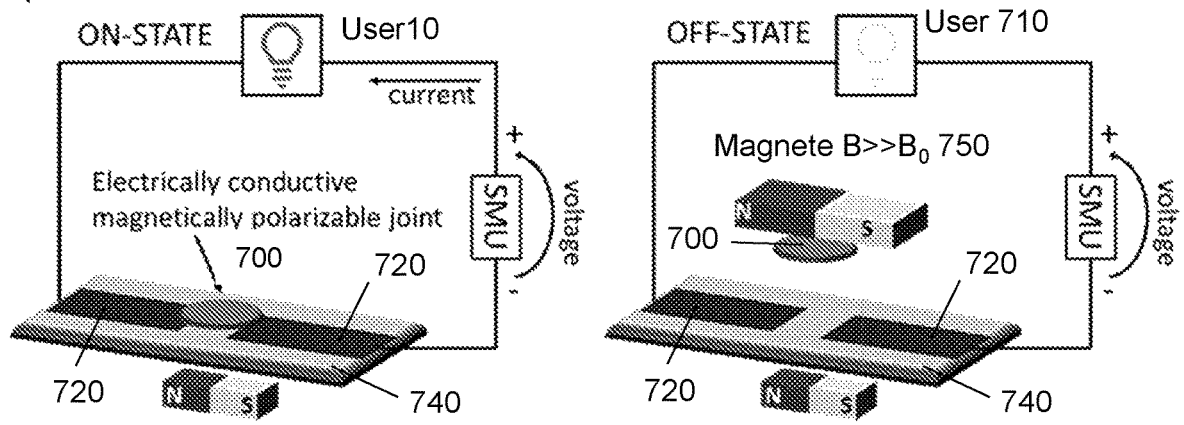
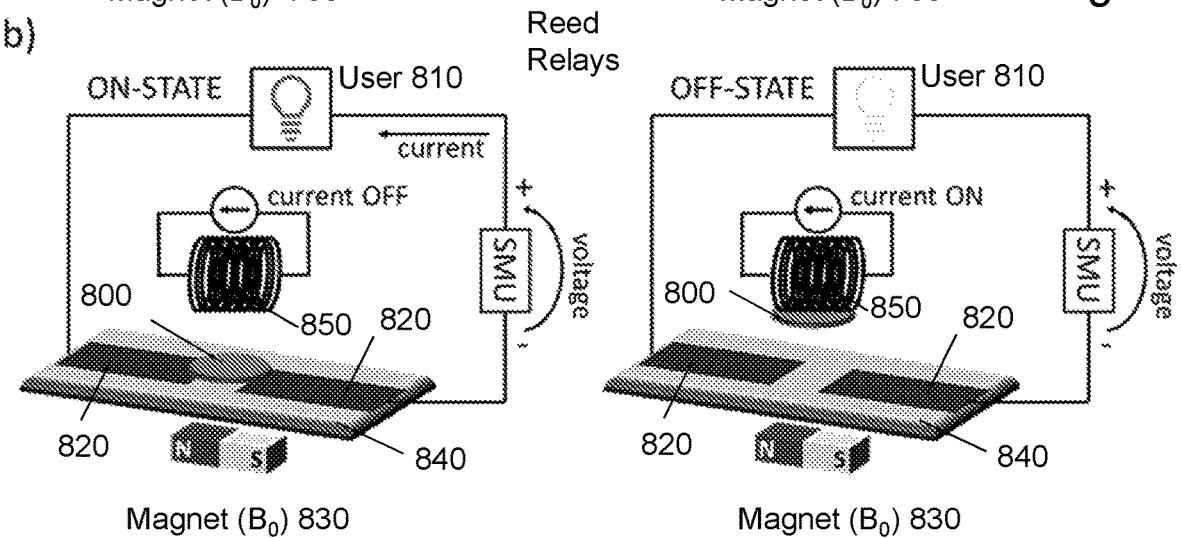
Fig.5
Fig.6

ELECTRICALLY AND/OR MAGNETICALLY ACTIVE MATERIAL AND PRODUCTION METHOD THEREOF

The present invention relates to a multifunctional product in the form of electrically conductive and electrically and magnetically polarizable and thermally conductive paste or ink or glue, a production method for said products and the use of these products for the production of electrically conductive and electrically and magnetically polarizable and thermally conductive components or devices.

The development of electrically conductive materials with electrical, magnetic or thermal properties and their composites has stimulated an ever-increasing exploitation of electromagnetic effects in a wide range of products, including, for example:

(i) magnetoresistive sensors and electro/magneto-rheological sensors for linear and angular (inertial) detection, proximity sensors, sensors for detecting the condition of opening/closing of doors and for fluid level control;

(ii) actuators for engines, haptic clutch systems and control valves/orifices;

(iii) structural vibration control components for adjustable vibration absorbers and shock absorbers for shear vibrations;

(iv) reed relays, electromechanical, magnetothermic (circuit breakers) and switches thereof;

(v) components for adjustable electrical connections/wirings relating to electrical conductivity or electrical resistance, electric and magnetic welding machines and electric and magnetic heaters;

(vi) agents for anti-electrostatic and/or dust-proof coatings (for example, anti-triboelectric coatings, possibly magnetically assisted);

(vii) conductive substrates, possibly magnetically polarizable, for energy conversion devices (for example, triboelectric generators, possibly magnetically assisted).

In this context, the liquid phase treatment of materials with electrical, magnetic or thermal properties in the form of pastes or inks or glues represents a step forward towards the development of coating or printing casting processes on an industrial scale (e.g. casting (drop casting), spray painting, jet printing (inkjet, flexographic, gravure, screen printing) that are reliable, inexpensive and compatible with flexible plastic and/or paper and/or fabric substrates, as well as rigid substrates made of glass or metal or combinations of these materials.

The liquid phase treatment can also enable to accurately modulate the electromagnetic properties by mixing multiple electrically conductive and/or electrically and/or magnetically polarizable and/or thermally conductive materials. Furthermore, the polymeric materials can be used as matrices that bind the above materials, creating composites with complementary properties, such as mechanical strength and/or flexibility and/or adhesiveness.

Most of the knowledge currently available on the practical exploitation of electromagnetic components in electronics is represented by bulky and/or rigid architectures, which are integrated on substrates based on metal-coated ceramic materials (for example, $Al_2O_3$, AlN, BeO) obtained through high temperature processes (for example, direct bonded copper—DBC, direct bonded aluminum—DBA, active metal brazed—AMB) substrates. Furthermore, the high temperature (>700° C.) of the heat treatment makes these integration processes incompatible with the printed circuit board—PCB) or printed wiring board—PWB as well as plastic/paper/fabric substrates or combinations of these materials.

In the field of production and/or assembly of electronic systems integrating multiple electromagnetic components there is therefore an unsatisfied need for functional materials in the form of pastes, inks and glues made of electrically conductive and electrically and magnetically polarizable and thermally conductive materials with desired combination of properties electrical, magnetic and mechanical, such that they can be used in electronic devices, possibly magneto-electrical and thermal, mechanically flexible obtained through low temperature processes.

WO2017/007568 describes a product of graphene-reinforced polyethylene terephthalate. Said product does not have magnetic properties.

Similarly, document US2017/158815 also describes a graphene/PEDOT compound with electrical functions. However, the document does not report any specific magnetic properties.

Castro J. ET AL: "Synthesis and characterization of low-loss $Fe_3O_4$-PDMS magneto-dielectric polymer nanocomposites for RF applications" WAMICON 2014, IEEE, 6 Jun. 2014 (2014 Jun. 6), pages 1-5, XP032620189, DOI: 10.1109/WAMICON.2014.6857768 retrieved on 2014 Jul. 16] describes a magneto-dielectric nanocomposite polymer that does not have electrical properties and in particular electrical conductivity.

With reference to the known art mentioned above, it is clear that the aforementioned documents do not describe the mixing of multiple components with different functional properties such as electrical, magnetic, thermal and mechanical properties for the development of electromagnetic products in the form of pastes, inks and glues, nor also processes for obtaining such multi-component products.

A first object of the present invention is to formulate products in the form of pastes, inks and glues made of electrically conductive and magnetically polarizable and thermally conductive materials, and polymeric materials. The functionality of the above products allows to fully or more effectively satisfy the needs not met by the known art.

A further object of the present invention is to provide methods for the executive formulation and use of the above products.

A further object is to provide a method of use of said products for manufacturing of electronic components in the wet and/or dried state.

Still a further object of the present invention is to use the previous electronic components, such as electromagnetic, to create sets of these components with multiple electromagnetic, thermal and mechanical properties for the realization of electronic and/or thermal components or devices.

Regarding the first aspect referred to the formulation of products in the form of pastes, inks and glues comprising electrically conductive and magnetically polarizable and thermally conductive components, and a polymeric component, in a first embodiment, the products comprise pastes or inks obtained from a polymeric component which is dissolved in a solvent before mixing with said electrically conductive and magnetically polarizable and thermally conductive components.

In an alternative embodiment, the products refer to glues obtained from an electrically conductive and magnetically polarizable component which is mixed inside the polymeric component, the latter being thermally brought to a fluid or liquid condition without necessarily using solvents.

More precisely, the products of the present invention are defined as pastes or inks according to their viscosity in combination with the operating conditions, i.e. in particular with the ambient temperature if not specified.

The following table shows the discrimination features of pastes and inks from glues, in accordance with the above definitions:

| Product family | Solvent | Viscosity [mPa s] |
|---|---|---|
| Paste | yes | ≥100 |
| Ink | yes | <100 |
| Glue | no | n.d. |

According to a feature of the products, the electrically conductive component comprises non-magnetically polarizable carbon-based materials such as graphite, graphene, carbon nanotubes, carbon black and/or ferromagnetic metals (such as, for example, Fe, Ni, and other metal alloys or from non-ferromagnetic materials, such as, for example, Au, Ag, Cu, Al, Mo, Ta and Mg.

According to a further feature of the products, the magnetic component comprises ferromagnetic, electrically conductive materials, for example ferromagnetic metals, or magnetically polarizable and electrically insulating materials (called "magnetic insulators"), for example: $Fe_3O_4$, NiO, $YBA_2Cu_3O_{6+x}$ and $MnF_2$.

A possible further feature of the products may be an electrically polarizable component comprising non-conductive but electrically active materials, for example electrically insulating materials, conductive materials coated with an electrical insulator, and electro-osmotically active particles.

According to another feature of the products, the polymeric component is expressed by plastics or elastomers that can be both electrically insulating and non-electrically and/or magnetically polarizable, and electrically conductive and/or electrically and/or magnetically polarizable. The polymeric component is able to provide the final product with the desired mechanical properties, such as mechanical strength and flexibility. These ones integrate with the electrical and magnetic functions expressed by the multiple components of the product. In the absence of the properties such as electrical conductivity and magnetic polarizability of the polymer matrix, the product necessarily also includes non-polymer electrical and magnetic components.

Depending on the features of the products shown above, the products are defined as electric or magnetic pastes or inks or glues if manufactured using electrically conductive materials and electrically and/or magnetically polarizable materials. For these products, the weight percentage (wt %) of the electrically and magnetically active component can vary as shown in the following table:

| Product | Product sub-family | Type of component | Wt % |
|---|---|---|---|
| Electric Pastes/inks/glues | Any electrically active polymer (electrically conductive and polarizable pastes/inks/glues) | Polymeric component | 100 |
| | Electrically conductive pastes/inks/glues | Polymeric component | 1-50 |
| | | Electrically conductive component | 50-99 |
| | Electrically polarizable pastes/inks/glues | Polymeric component | 1-50 |
| | | Electrically polarizable component | 50-99 |
| Electric and magnetic pastes/inks/glues | Any electrically and magnetically active polymer | Polymeric component | 100 |
| | Electrically active and magnetically polarizable pastes/inks/glues | Polymeric component | 1-50 |
| | | Electrically conductive and magnetically polarizable component | 50-99 |
| Magnetic pastes/inks/glues | Any electrically and magnetically active polymer | Polymeric component | 100 |
| | Electrically non-conducting and magnetically polarizable pastes/inks/glues | Polymeric component | 1-50 |
| | | Electrically non-conducting and magnetically polarizable component | 0-95 |

Referring to the second aspect of the invention, the latter refers to a method for the production of a product according to one or more of the forms and executive variants described above. More precisely, the method comprises the following steps:

(i) selecting at least one or more polymeric material for the polymeric component;

(ii) dissolving the polymeric component through a heating thermal process, or using a solvent that dissolves the polymeric materials of the polymeric component, or by means of a combination of heat treatments and using a solvent;

(iii) selecting for the non-polymer components a material or a mixture of materials chosen from electrically conductive materials, optionally but not necessarily also electrically polarizable materials, and magnetically polarizable materials since the latter are electrically conductive or electrically insulating materials;

(iv) homogeneously mix the polymer component and the other components through mechanical stirring with temperature control.

(v) depositing the product on a substrate, transforming the deposited product into a functional object in a wet or dry form with a desired geometric shape.

As regards step (ii), an embodiment preferably provides that the temperature and the solvent are compatible with the chemical and thermal stability of the non-polymeric electrical and magnetic components.

The products obtained are in the liquid or semi-liquid phase and are classified as pastes or inks or glues according to their characteristics, in accordance with the definitions previously described.

With reference to step (i) the materials for the polymeric component preferably include plastics or elastomers.

Within the step (ii) in the case of pastes and inks the polymers are dissolved in the presence of a solvent, while in the case of glues, no solvent is used and the dissolution of the polymeric component occurs through a process exclusively of thermal heating, which however can also be applied for pastes and inks.

Still with reference to step (ii) according to a preferred embodiment, it is provided to initially thermally dissolve the polymer, at least partially, and subsequently to add the solvent. Thanks to this sequence of sub-steps of step (ii) a final paste is obtained with an excellent mixing of the different components.

According to an embodiment of the above sub-steps, it is preferable to dissolve the peripheral component by heating to a temperature equal to or higher than the melting temperature of the polymer, before adding the solvent.

With reference to the formulations of pastes and/or inks, the polymer and the solvent must have a Hildebrand parameter of similar solubility.

In an embodiment, the polymeric component is preferably dissolved in volatile organic solvents, i.e. having high vapor pressure. For example, these solvents can be chlorobenzene, xylene, dimethylsulphoxide, 1-methoxy-2-propanol, toluene, acetone, ethanol, 2-propanol (vapor pressures at 25° C. are about 12 mm Hg for chlorobenzene; about 1.4 mm Hg for o-dichlorobenzene, about 8.3 mm Hg for m-xylene; about 6.6 mm Hg for o-xylene, about 8.7 mm Hg for p-xylene, about 0.6 mm Hg for dimethyl sulfoxide, about 10.9 mm Hg for 1-methoxy-2-propanol; about 225 mm Hg for acetone; about 58 mm Hg for ethanol and about 44 mm Hg for 2-propanol).

According to an embodiment, aqueous solvent can also be used alternatively to the organic solvents.

Preferably, for pastes and inks, obtained according to an embodiment of the process which involves mixing the solvent with the other components through a thermal heating process at a temperature of between 60 and 90° C.

Thanks to the above, the pastes and/or inks can be processed and hardened at low temperature (<100° C.), possibly also at room temperature. This prevents the pastes and/or inks obtained from having to be treated at high temperatures (>100° C.). Therefore, the pastes and/or inks described here can advantageously be applied on substrates sensitive to temperature, i.e. plastics, papers and fabrics.

In relation to the case of glues, solvents are not used and the polymeric component is dissolved with a heat treatment heating to a temperature equal to or higher than the melting temperature of the polymeric component. This also means that said temperatures must also be applied during the subsequent step (iii), as well as during the use of said glues.

About step (iii), according to an embodiment, one or a combination of powder materials can be used as electrically conductive components chosen from: graphite and/or graphene and/or derivatives of graphene and/or carbon nanotubes and/or acetylene black. Graphene is preferably obtained by evaporation and lyophilization of the dispersion of graphene flakes produced according to Fondazione IIT patent IT102015000077259, Del Rio Castillo et al.

According to an embodiment, iron oxides (for example, $Fe_3O_4$) and/or iron (Fe) are preferably used as magnetically polarizable components due to their easy availability and low costs.

About step (iv), the times and temperatures of the mixing process of the product components can be adjusted to control the evaporation of the solvent, i.e. the concentration of the solid component in the pastes or inks, as well as to obtain a satisfactory mixing of the different components in the glues.

With regard to step (v), the pastes and/or inks and/or glues previously described can be advantageously processed with industrially scalable, reliable and economic processes, i.e. casting and/or coating and/or printing processes, for example: inkjet printing processes, spray painting, screen printing. These processes, carried out on the products in the liquid phase, can possibly be carried out at low temperature (for example room temperature or in any case ≤200° C.).

With reference to the third aspect of the invention, this is directed to methods for the use of the above described products (pastes, inks and glues) and the corresponding components formulated in the wet or dry state (obtained by depositing the pastes or inks or glues) for the manufacture of flexible and possibly wearable electronic devices, such as magnetic and/or electrical) on plastic and/or paper and/or fabric substrates, as well as flexible components that can be processed at low temperatures.

According to an embodiment of the invention, said devices include:
i) electromagnetic welders;
ii) magnetoelectric heaters;
iii) anti-electrostatic materials and coatings, or multifunctional (magnetic) materials and coatings passivating the static electric charge (anti-triboelectric);
iv) multifunctional magnetic electrodes for energy generators and converters;
v) magnetoresistive sensors;
vi) Electromechanical relays/reed relays, or circuit breakers;
vii) Electromechanical actuators such as, for example, valves or the like.

These and other features and advantages of the present invention will become clearer from the following description of some embodiments illustrated in the attached drawings in which:

FIG. 1 schematically shows an embodiment of the invention consisting of a magnetoelectric welding device for plastics.

FIG. 5 schematically shows an embodiment of an electromagnetic relay made with the products of the present invention.

FIG. 6 schematically shows an embodiment of a reed relay made with the products of the present invention.

Figure 7:
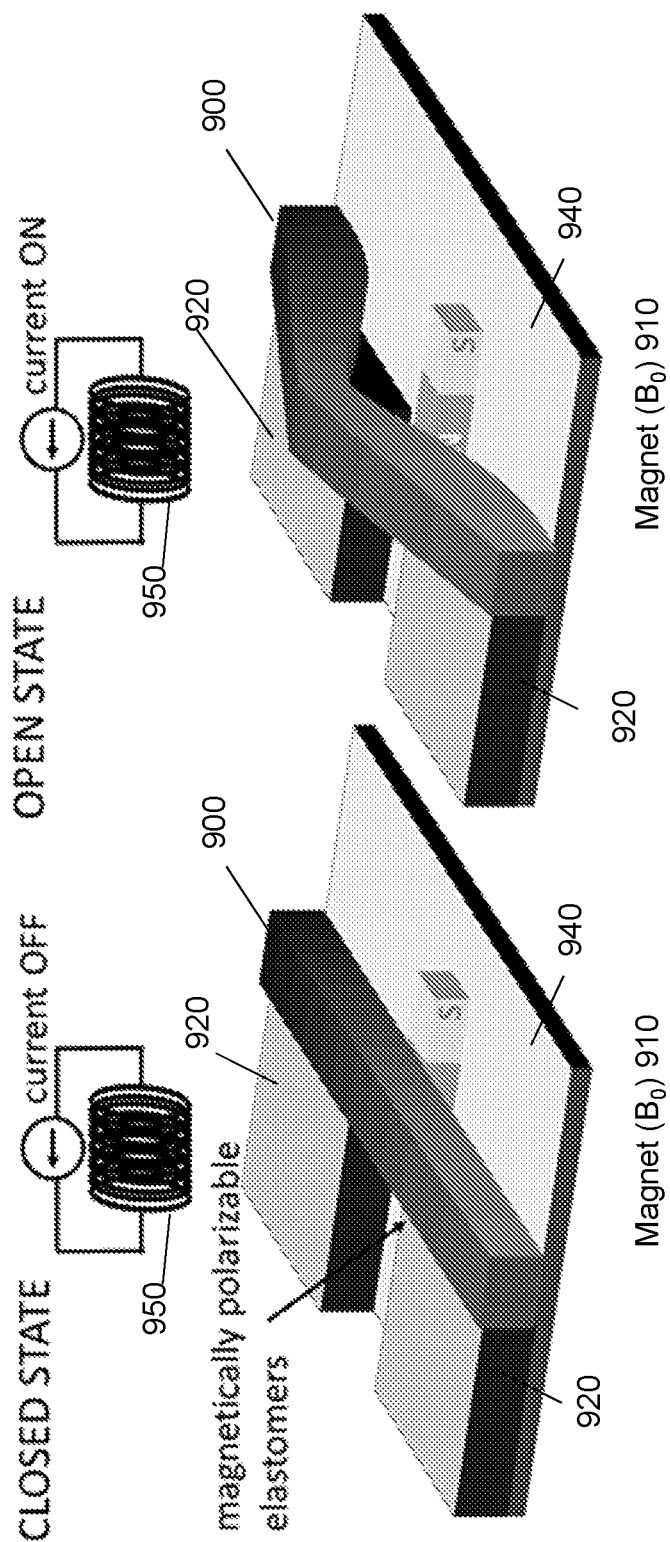

FIG. 7 schematically shows an embodiment of an electromechanical actuator, i.e. a valve.

EXAMPLE 1

Example 1 refers to electrical and magnetic products, particularly to a precise formulation of electrically conductive and magnetically polarizable products, for example in the form of pastes or inks or glues.

In this example, a graphene flake powder is used for the formulation of the electrically conductive component of the product.

The graphene flake powder is produced from graphite through a freeze-drying process of a dispersion of graphene flakes in N-methyl-2-Pyrrolidone, the latter obtained by "wet-jet milling" exfoliation from graphite. Further details on said graphene production process by means of wet-jet milling are contained in Fondazione IIT patent IT102015000077259, Del Rio Castillo et al.

A magnetic component of Fe or $Fe_3O_4$ is provided. The Fe component is in the form of commercially available Fe powder (MAGNET EXPERT, UK) and is used as a magnetically polarizable and electrically conductive component.

The $Fe_3O_4$ component is in the form of commercially available $Fe_3O_4$ nanoparticle powder (Sigma Aldrich) and can be used as a magnetically polarizable and electrically insulating component.

PET is used as a polymeric material for the polymer component of the product. Experimentally, commercially available PET called Vivak, produced by Bayer Sheet Europe GmbH, Germany, was used.

The percentage by weight of the polymeric component in the solid component of the electric paste (called P1) is 20, as summarized in detail in the following table:

| Pastes | Component family | Component weight content (wt %) |
|---|---|---|
| P1 | Polymer (PET) | 20 |
| | Graphene flakes | Up to 80 |
| | Other components | To fill up to 100 |
| P1a | Polymer (PET) | 20 |
| | Graphene flakes | 50 |
| | Fe powder | 30 |
| P1b | Polymer (PET) | 20 |
| | Graphene flakes | 50 |
| | $Fe_3O_4$ nanoparticles | 30 |

PET is melted at 200° C. for 30 minutes and dissolved in chlorobenzene at a concentration of 50 g/l. The mixture thus obtained is mechanically stirred for 1 hour at 90° C. Subsequently, the graphene flake powder with a percentage by weight in the solid component of 50% and the Fe powder in an amount of 30% by weight for the product P1a (excluding the solvent) and the powder are added to the PET mixture of $Fe_3O_4$ nanoparticles, in an amount equal to 30% by weight for the product P1b (excluding the solvent). The paste is further mechanically stirred at 50° C. for 12 hours.

By depositing the aforementioned paste on flexible substrates, for example, plastic and/or paper and/or fabrics or on rigid substrates, such as for example glass and/or metal sheets and its subsequent drying at room temperature, electrically conductive components are obtained in the form of a coating such as film or the like.

The thickness of the resulting components can vary between 30 μm and 100 μm, depending on the parameters of the deposition process.

In particular, the films on PET substrates were used directly in the form in which they were produced, while the films on glass substrates were separated from the substrate by delamination with the aim of obtaining films of electrically conductive material separated from the substrate (self-standing film).

EXAMPLE 2

Different pastes/glues/inks with electrical and magnetic properties are formulated in the type of electrically conductive and magnetically polarizable paste/glue/ink (P2) or electrically insulating and magnetically polarizable paste/glue/ink (P3) such as those known in the state of the art. As described in the following examples, these pastes/glues/inks can be used for the production of polarizable magnetic products.

In the case of the electrically conductive and magnetically polarizable product (P2), Fe powder, commercially available (MAGNET EXPERT, UK), is used as a material for the electrically conductive and magnetically polarizable component. Poly (vinyl alcohol) (PVA), commercially available (Sigma Aldrich), or commercially available polydimethylsiloxane (PDMS) and named SYLGARD 184 (DOW CORNING) are used as polymeric materials for the polymer component.

With reference to the above, water and/or ethanol are used in an embodiment such as solvents for the PVA for the formulation of products in the form of paste or ink.

In an embodiment, chlorobenzene, chloroform, acetone can be used as solvents for the PDMS for the formulation of products in the form of paste or ink or glue.

In the case of the electrically insulating and magnetically polarizable product (P3), the commercially available $Fe_3O_4$ nanoparticle powder (Sigma Aldrich) is used as the electrically polarizable and electrically insulating component.

The electrically insulating and magnetically and/or electrically polarizable products can be transformed into electrically conductive and magnetically polarizable products (P4, P5) by adding powdered graphene flakes, preferably obtained by drying the dispersion of graphene flakes in N-methyl-2-pyrrolidone obtained by wet-jet milling exfoliation of graphite described in IIT patent IT102015000077259, Del Rio Castillo et al. or by adding Fe powder.

The different components of the products (such as pastes/inks/glues) are mixed with a planetary centrifugal mixer (Thinky ARE-250, Mixing and Degassing Machine, UK) for 3 minutes at 2000 rpm.

The percentages by weight, referred to the sum of the weights of the solid components excluding the solvent, of the various components of the products indicated as P2, P3, P4 and P5 are indicated in the following table.

| Product | Component family | wt % |
|---|---|---|
| P2 | Polymer (PVA or PDMS) | 25 |
| | Fe powder | 75 |
| P3 Reference product known in the art | Polymer (PVA or PDMS) | 25 |
| | $Fe_3O_4$ nanoparticle powder | 75 |
| P4 | Polymer (PVA or PDMS) | 25 |
| | $Fe_3O_4$ nanoparticle powder | 62.5 |
| | Graphene flakes powder | 12.5 |
| P5 | Polymer (PVA or PDMS) | 25 |
| | $Fe_3O_4$ nanoparticle powder | 62.5 |
| | Fe powder | 12.5 |

By depositing electrical and magnetic products on flexible substrates such as plastic and/or paper and/or fabrics or on rigid substrates such as glass and/or metal sheets, the electrically conductive and magnetically polarizable components are obtained in the form of a film both in the wet state (composition based on PVA), both in dry state (composition based on PDMS).

An embodiment of the invention provides that wet film can be encapsulated by a thin plastic film (400 μm) to avoid drying.

The solid state films are dried at 60° C. for 60 minutes.

The thickness of the resulting components can vary between 35 μm and 100 μm, depending on the parameters of the deposition process.

The films on PET substrates are used directly in the form in which they were produced, while the films on glass substrates are separated from the substrate by delamination with the aim of obtaining films of electrically conductive material separated from the substrate (self-standing film).

The latter can be easily attached to plastic, glass, or metal substrates due to the adhesiveness of the PDMS.

Some electronic devices made using the products or their corresponding embodiments in films will be described below according to examples 1 or 2.

EXAMPLE 3

Electromagnetic Welding

Figure 1:
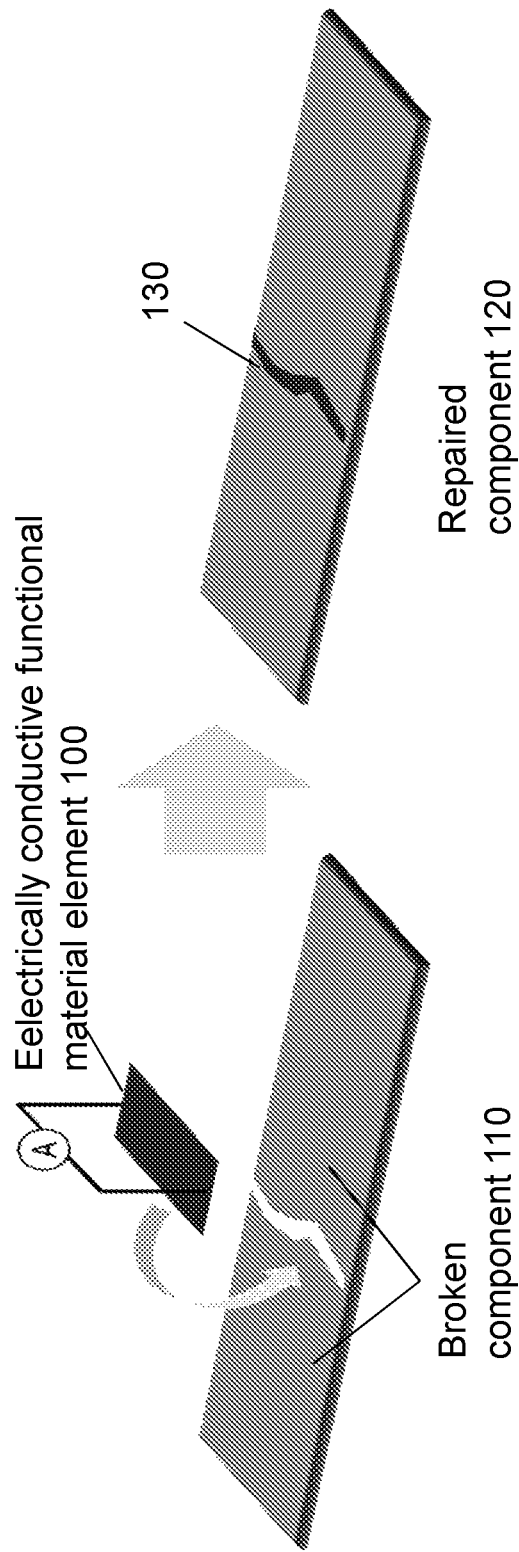

The material defined P1 in example 1 is used to manufacture an electric welder for welding plastics and/or elastomers and for repairing electrical connections on plastic substrates and/or elastomers, as shown in FIG. 1.

Electric welding through the use of P1 is performed through the following steps:

i) P1 is deposited by a doctor blade in the form of a strip or track indicated with 100 in FIG. 1 in one of the two embodiments described in example 1, or on PET or glass. In the latter case, the film is subsequently delaminated from the substrate;

ii) the embodiment of P1 contacts the broken component indicated with 110 in FIG. 1;

iii) a potential difference is applied to the opposite ends of the track 100 so that it conducts an electric current. The heat generated by the Joule effect melts track 100 which fills interstices 130 of the breaking zone and joins the broken component.

With reference to step iii) it is possible to foresee a continuous or alternating potential difference. In an embodiment, an alternating potential difference can be applied to the ends of track 100 by generating a continuous change in the magnetic polarization of the magnetic components. The resistance to rapid change of magnetic fields produces additional heat which adds up to heating by Joule effect.

According to an executive variant of step iii) instead of a potential difference it is possible to apply an externally generated alternating magnetic field (for example from a coil in which an alternating current flows). This alternating magnetic field can be used to heat track 100 through the electromagnetic induction process.

Figure 2:
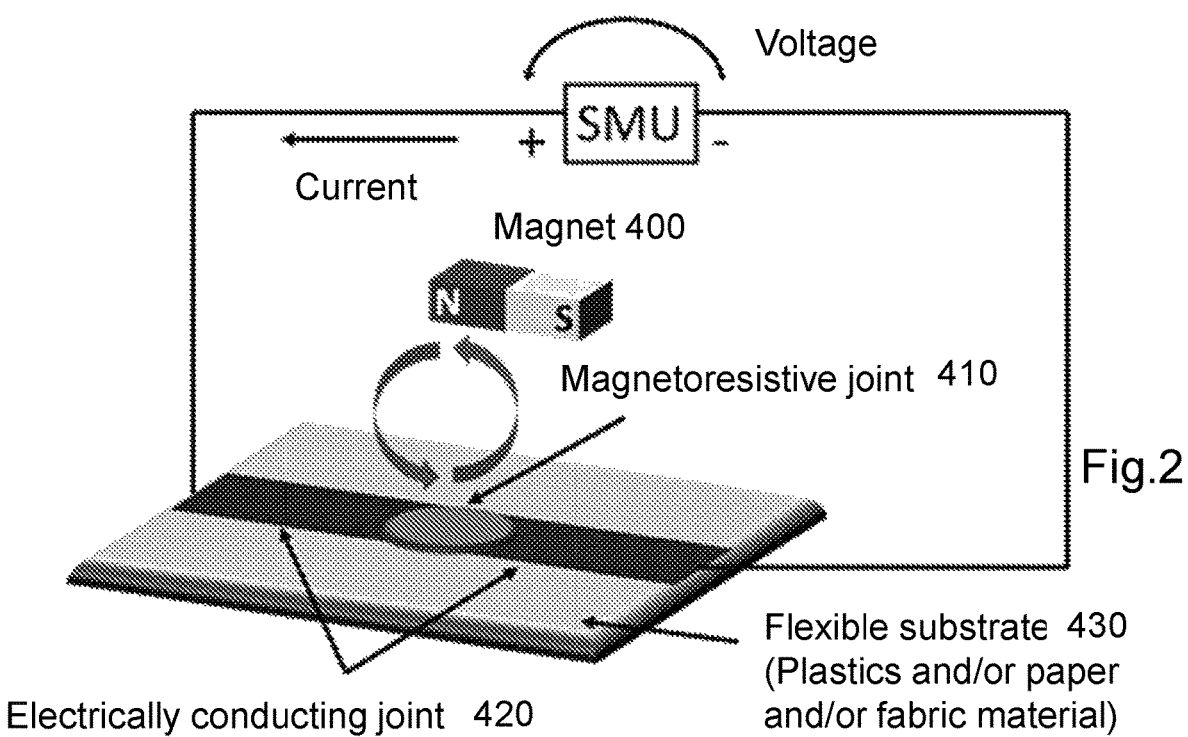
FIG. 2 shows a schematic illustration of a magneto-resistive sensor made with functional materials according to the present invention.

FIG. 2 shows the dependence of the electrical resistance as a function of the current applied for a) a PET track coated with a P1 film and b) a track of a P1 film separated from the substrate by delamination.

The example refers to a track with a geometric area of 1×5 cm2, thickness of about 75 μm.

For the specific case of the products P1a and P1b of example 1, by applying an electric current greater than 300 mA, both tracks melt well to perform the sealing function of plastics and/or elastomers.

EXAMPLE 4

Electromagnetic Heaters

In this example, the tracks made using the defined product P1, such as those shown in example 2, are used as electric heaters. These heaters work by applying a voltage to the ends of the tracks themselves. The heat is generated by Joule effect and the temperature can be easily controlled up to values compatible with the thermal stability of the substrates, i.e. temperatures below the softening and/or melting and/or flammability temperature of the substrate.

According to an embodiment, an alternating potential difference can be applied alternately to a constant electrical voltage at the ends of the tracks, generating a continuous change in the magnetic polarization of the magnetic components. The resistance to rapid change of magnetic fields produces additional heat which adds up to heating by Joule effect.

According to an executive variant, alternatively to a potential difference, an alternating magnetic field generated externally (for example from a coil in which an alternating current flows), can be used to heat the tracks through the electromagnetic induction process.

EXAMPLE 5

Multi-Functional (Magnetic) Anti-Electrostatic Materials and Coatings, Namely Multi-Functional (Magnetic) Materials and Coatings Passivating the Static Electric Charge (Anti-Triboelectric)

The product P1 of example 1 can also be used to obtain an anti-electrostatic effect or an anti-triboelectric plastic coating.

An embodiment provides a film comprising material P1 of Example 1 with a thickness of 40 μm and equipped with a surface electrical resistivity (Rsheet) of 21±0.5 Ω/sq.

A PET coated with a film of material P1 according to example 1 75 μm thick has an $R_{sheet}$ of 39±2.2 0/sq. These $R_{sheet}$ values enables the dissipation of the static electric charge, avoiding unwanted triboelectric effects, including: electrostatic discharges in electronic devices made with plastic materials; the attraction and adhesion of dust particles on the surfaces of plastic materials, which cause the formation of dirt residues in electrically charged fabrics during the stages of their processing. As for the reduction of the attraction/adhesion effect of the dust particles, this type of coating has a self-cleaning function.

Figure 3:
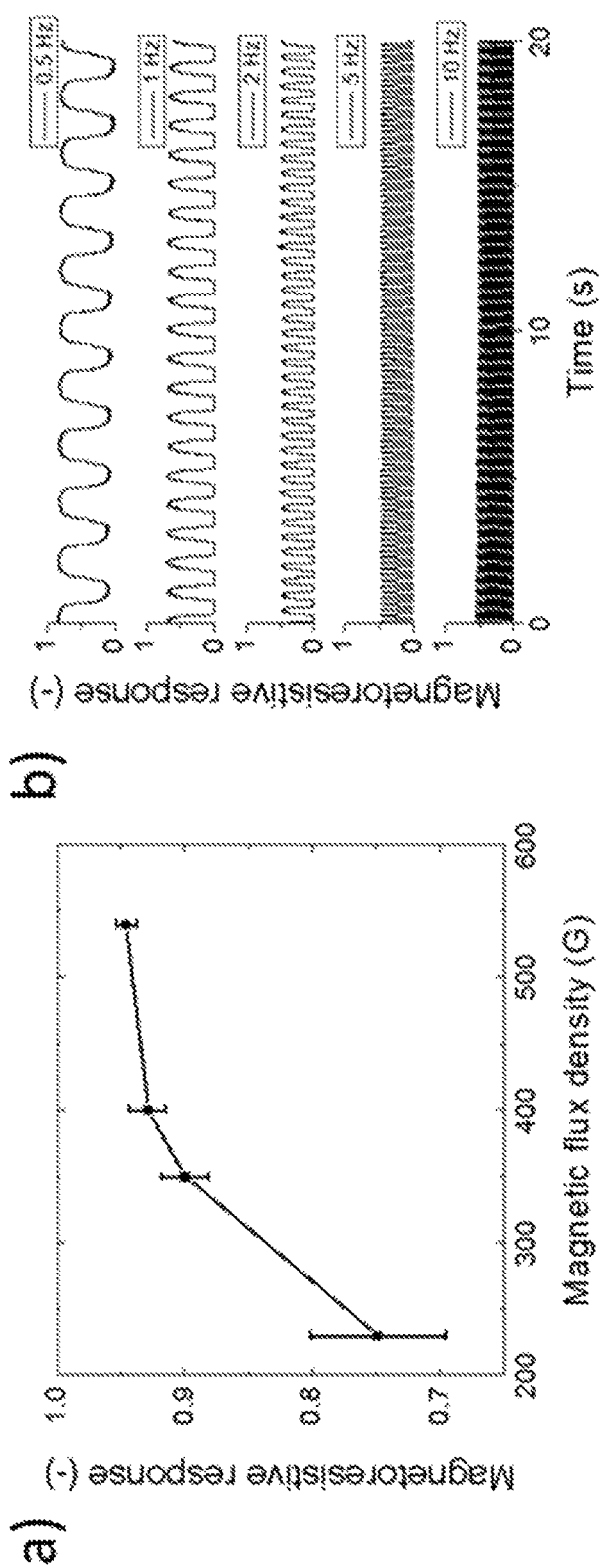
FIG. 3 shows graphs related to:
a) magneto-resistive response of a magneto-resistive sensor made with the products of the present invention according to the density of the magnetic flux;
b) magneto-resistive response of the magneto-resistive sensor as a function of time, while on/off cycles of magnetic flux density are applied at different frequencies between 0.5 Hz and 10 Hz.

A PET with coating of a film of material P1 according to example 1 also has a shielding effect against electromagnetic waves and this effect enables a reduction of between 5 and 10 dB in the frequency range of electromagnetic waves of between 5 MHz and 10 MHz, as shown in FIG. 3. This frequency field of electromagnetic waves includes the NFC (Near Field Communication, or 13.56 MHz) frequency. PET coated with the aforementioned material P1 therefore acts as a protection for a body against NFC electromagnetic waves.

EXAMPLE 6

Multifunctional (Magnetic) Electrodes for Energy Generators and Converters

Products P1, P2, P4 and P5 with PDMS as a polymer component can be used as electrodes for magnetically assisted triboelectric generators. P2, P4 and P5 films on rigid or flexible substrates, or films of the above products in "self-standing" form, can be used as negative electrodes of triboelectric generators, both rigid and flexible. In particular, PDMS is intrinsically a negative triboelectric material. The presence of graphene makes the aforementioned films electrically conductive, capable of performing the function of electrodes to make the charge separate at the interface between positive and negative triboelectric materials flow in an external circuit. In addition, the magnetic component allows to assist the operation of the triboelectric generator, guaranteeing a control of the mechanical movement through the application of a magnetic field. In the latter configuration, the devices are called "magnetic-assisted non-contact triboelectric generator". Examples of such devices according to the known art are described in:

"High-Performance Transparent and Flexible Triboelectric Nanogenerators Based on PDMS-PTFE Composite Films", Gui-Zhong Li Gui-Gen Wang Da-Ming Ye Xu-Wu Zhang Zhao-Qing Lin Hai-Ling Zhou Fei Li Bao-Lin Wang Jie-Cai Han, First published: 5 Mar. 2019 https://doi.org/10.1002/aelm.201800846 and "A high output magneto-mechano-triboelectric generator enabled by accelerated water-soluble nano-bullets for powering a wireless indoor positioning system", Kyung-Won Lim, ab Mahesh Peddigari, in Chan Hee Park, in Ha Young Lee, b Yuho Min, to Jong-Woo Kim, to Cheol-Woo Ahn, to Jong-Jin Choi, to Byung-Dong Hahn, to Joon-Hwan Choi, to Dong-Soo Park, to Jae-Keun Hong, to Jong-Taek Yeom, to Woon-Ha Yoon, in Jungho Ryu, *c Sam Nyung Yi*b and Geon-Tae Hwang, Energy & Environmental Science, 2019.12, 666-674, https://pubs.rsc.org/en/content/articlelanding/2019/ee/c8ee03008a.

EXAMPLE 7

Magnetoresistive Sensors

The product defined as P2 in example 2 was used to develop magnetoresistive sensors both in the wet and in the solid state. A schematic example of these sensors is illustrated in FIG. 2.

According to an embodiment, the magnetoresistive sensor has a magnetoresistive junction element 410 connecting two tracks of electrically conductive material 420 together. When the magnetoresistive junction 420 enters a magnetic field, for example, the field generated by a magnet 400, the electrical resistance of the joint changes. The change in resistance generally depends both on the distance of the magnet and on the magnetic field (B) generated by the magnet, i.e. the direction and intensity of the magnetic field.

In an embodiment, PVA and PDMS can be used as the material for the polymeric matrix of the magnetoresistive junction for the realization of the junction in the wet state and in the solid state condition.

According to an embodiment, moreover, for the two electrically conductive tracks 420 it is possible to use the product called P1 according to one or more of the variants and embodiments described in example 1.

In an embodiment, the material used for the joint is of the type defined as P5 in the previous description. In this case, the magnetic polarization of the magnetoresistive junction 410 is reversible.

In particular, the rheology of the PVA or the viscoelasticity of the PDMS allow the ferromagnetic components to orient their magnetic dipoles along the magnetic field B, and then to return to random and disordered orientation states (for example, their initial state).

In an embodiment, the two electrically conductive tracks are provided on a substrate indicated with 430.

In an experimental embodiment, the two electrically conductive tracks 420 made of the material defined as P1 are made with a surface of $1 \times 5$ cm$^2$ and a thickness of about 80 µm, while the magnetoresistive joint 410 is provided with a surface of $1 \times 1$ cm$^2$ and a thickness included between 100-150 µm.

Experimentally, a magnetic field is oriented parallel to the tracks 410 while the reduction of the electrical resistance caused by the alignment of the ferromagnetic components is measured.

FIG. 3a shows the magnetoresistive response of a magnetoresistive sensor as a function of the intensity of the magnetic field B, i.e. the density of the magnetic flux. The magnetoresistive response was calculated as $|\Delta R/R_0|$, where $\Delta R$ is the difference between the electrical resistance before applying the magnetic field B, and $R_0$ is the initial electrical resistance of the sensor.

The sensor was preconditioned with 10 on-off application cycles of B for each of the different magnetic flux density values provided.

The magnetoresistive response was calculated on 10 different cycles for each magnetic flux density value. The magnetoresistive response increases by increasing the density of the magnetic flux. FIG. 3b shows the sensor's magnetoresistive response as a function of time, with the on-off cycles of application of the magnetic field performed at different frequencies between 0.5 Hz and 10 Hz. The magnetoresistive response is greater than 0.5 at the frequency. lower than 1 Hz, while they stabilize around 0.5 for a higher frequency up to 10 Hz, indicating a sensor operating response time of less than 100 ms.

Wet state sensors exhibit a faster and stronger magnetoresistive response than solid state sensors, but they must be properly encapsulated to prevent the paste from drying out.

Figure 4:
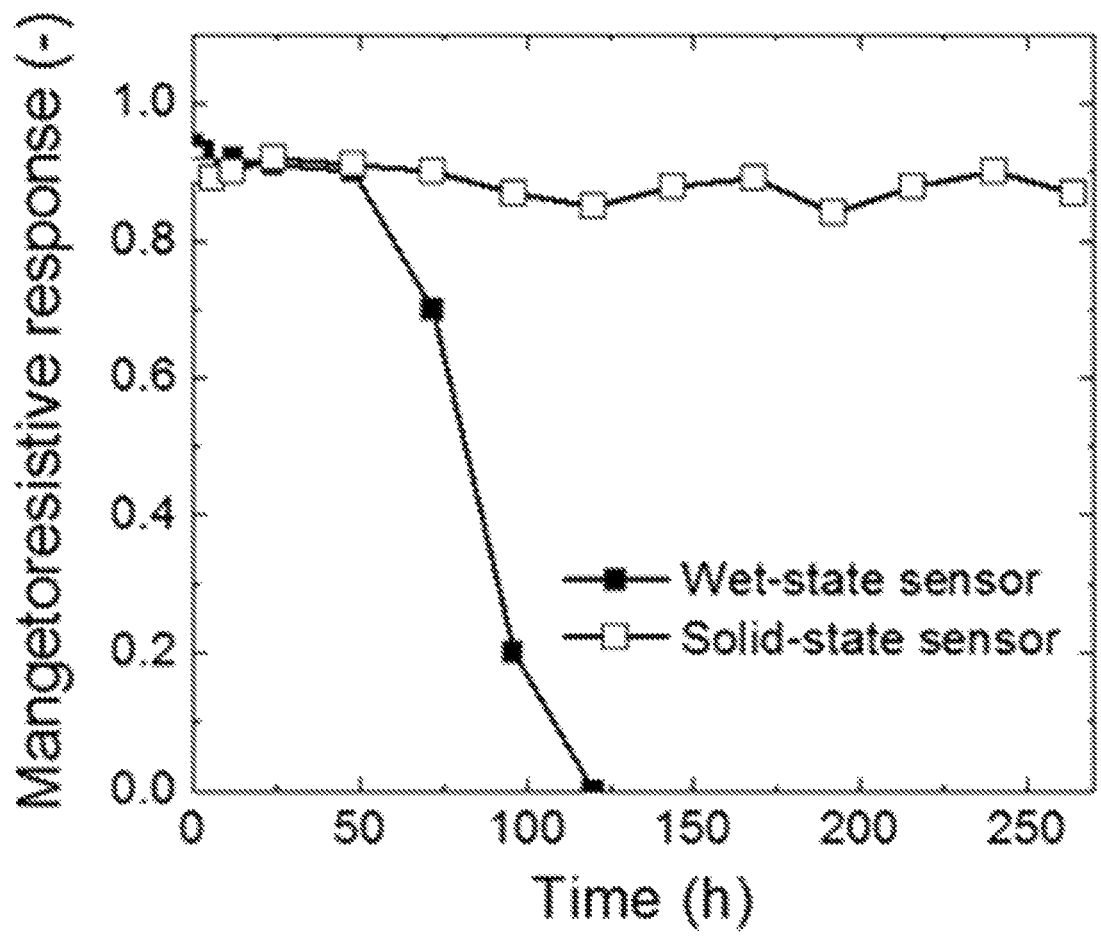
FIG. 4 shows a graph relating to the comparison of the magneto-resistive response over time of magneto-resistive sensors, made with the products of the present invention, in the dry and wet state.

FIG. 4 illustrates the comparison between the responses of solid-state and wet-state magnetoresistive sensors over time (up to 250 hours). The data demonstrate that the initial magnetoresistive response of wet state sensors is higher than that measured for solid state sensors. However, the magnetoresistive response of the wet state sensor begins to drop significantly after 50 hours, completely failing after 120 hours. In contrast, solid-state sensors optimally reproduce their initial magnetoresistive behavior for over 250 hours.

EXAMPLE 8

Electromechanical and Reed Type Relays

With reference to FIGS. 5 and 6, these show the use of the product defined P2 and described in example 2 for the construction of an electromechanical relay or a reed relay.

The P2 product described in Example 2 comprises an electrically conductive and magnetically polarizable component.

In the embodiment relating to the electromagnetic relay, an electrically conductive and magnetically polarizable junction element is indicated with 700 and constitutes the electrical connection bridge between two conductive material tracks 820 insulated from each other, which junction element 700 is alternatively movable between one contextual electrical contact position with the two tracks 720 and a spaced position and not in contact with at least one of the two tracks 820.

A magnet 730 that generates a magnetic field acts in the sense of permanently attracting the junction element 700 in the position in which it creates the electrical connection between the two tracks 720.

As shown in the figure, in this case the power supply circuit of the user 710 is closed allowing an electric current to pass through said user.

By providing a magnet 750 which generates a magnetic field of greater intensity than that of magnet 730, it is possible to move junction element 700 to the position of the left figure, i.e. in a condition of detachment from tracks 720, and therefore of opening of the circuit of user power supply 710.

In the illustrated embodiment the tracks are made on an insulating substrate 740.

The tracks 720 can be in the form of an electrically conductive film deposited on the said substrate, or of a "self-standing" material fixed on the surface of the said support.

FIG. 6 shows a reed-type relay. The structure is similar to that of the example of FIG. 5. In this case, however, magnet 750 is replaced by a resistive magnet 850 powered to attract itself and therefore detach junction element 800 from conductive tracks 820 on substrate 840.

According to FIG. 6, the reed relay has a substrate 840 on which electrically conductive tracks 820 are present. A junction element 800 for tracks 820. The user is indicated with 810.

Example 10 Electromechanical actuator, for example, valves or the like.

FIG. 7 shows an executive example of an electromechanical actuator, with particular reference to the passage for the fluid of an electrically controllable valve.

Generally, the example shown has a passage duct delimited laterally by two elements 920 which form a channel between them which is delimited on the front and rear side, for example, by a closing wall which can withstand even several years of stress.

The duct can be closed at the inlet and/or outlet ends by a shutter 900 which is obtained from the product P2, and therefore attributable to the components described in example 2.

The P2 material has electrical and magnetic functionality, in particular it is magnetically polarizable and electrically conductive. The magnetically polarizable and electrically conductive components can be chosen from one or more of the components of the examples and in the executive variants described above.

Advantageously, shutter 900 comprises a polymer matrix with characteristics of elastic deformability, or an elastomer which allows an elastic deformation.

Shutter 900 is switched to the closed condition by the magnetic field of a magnet 910 which stably maintains said shutter 900 in the undeformed and closed condition of the passage, while it is deformed by means of a polarization magnetic field generated by an electromagnet indicated with 950.

In the illustrated embodiment, the valve structure comprises a substrate 940 for supporting side walls delimiting the channel which leads to the passage opening while the opening is provided at the head ends of said walls and at said head ends the ends of the obturator are attached, which is made as a deformable crosspiece which is placed at the closure of the passage in its undeformed condition. The electrical conductivity of the valve enables integration with electrical circuits capable of providing a retroactive electrical response to the state of the valve, i.e. the closing or opening condition of the same.

The invention claimed is:

1. A functional product provided as an electrically and/or magnetically active paste, ink, or glue, comprising:
   a first component consisting of an electrically conductive, non-magnetically polarizable component;
   a second component consisting of an electrically conductive, magnetically polarizable component; and
   a matrix of a polymeric material binding the first component and the second component, the matrix being electrically conductive.

2. The functional product according to claim 1, wherein the first component is constituted by one of the following materials or a combination thereof: a magnetically non-polarizable material comprising carbon, a metal material, and a non-ferromagnetic or ferromagnetic material.

3. The functional product according to claim 1, wherein the functional product is provided as a glue.

4. The functional product according to claim 1, wherein the matrix is constituted by one or a combination of two or more of polyurethane; polydimethylsiloxane; co-polyesters of polyethylene terephthalate; and polyvinylacetate.

5. A method of producing a functional product according to claim 1, the method comprising the steps of:
   (i) selecting one or more polymeric materials for the matrix;
   (ii) dissolving the matrix;
   (iii) providing a mixture of materials comprising the electrically conductive, non-magnetically polarizable component and the electrically conductive, magnetically polarizable component;
   (iv) homogeneously mixing the matrix and the mixture of materials by mechanical stirring to produce the functional product; and
   (v) depositing the functional product on a substrate, and transforming the deposited functional product into a functional object having a liquid or solid phase with a desired geometrical shape;
   wherein step (ii) is carried out alternatively or in combination according to a process selected from the group consisting of:
   a thermal heating process,
   using a solvent to dissolve polymeric materials of the matrix;
   a thermal heating treatment and solvent combination; and
   a first initial step comprising thermally melting the matrix, a subsequent second step of adding the solvent, and a heating/cooling step at a temperature equal or lower than 100° C.

6. The method according to claim 5, wherein the functional product is produced as a paste or an ink by carrying out step (ii) by using the solvent to dissolve the matrix.

7. The method according to claim 5, wherein said solvent is an organic solvent or water.

8. The method according to claim 5, wherein the matrix is dissolved in a volatile organic solvent having a high vapor pressure.

9. The method according to claim 5, wherein the solvent is an organic solvent selected from the group consisting of chlorobenzene, o-dichlorobenzene, m-xylene, o-xylene, p-xylene, dimethylsulfoxide, and 1-methoxy-2-propanol.

10. The method according to claim 9, wherein the solvent has a vapor pressure at 25° C. of:
   about 12 mmHg for chlorobenzene;
   about 1.4 mmHg for o-dichlorobenzene;
   about 8.3 mmHg for m-xylene;
   about 6.6 mmHg for o-xylene;
   about 8.7 mmHg for p-xylene;
   about 0.6 mmHg for dimethylsulfoxide; or
   about 10.9 mmHg for 1-methoxy-2-propanol.

11. The method according to claim 5, wherein step (iv) is performed by mechanical stirring at a temperature between about 60 and 90° C.

12. The method according to claim 5, wherein the functional product is provided as a glue by carrying out step (ii) using a thermal treatment that comprises heating the matrix without using any solvents.

13. The method according to claim 5, wherein step (iv) comprises mixing by mechanical stirring at a temperature between about 200° C. and 250° C.

14. The method according to claim 5, further comprising a drying step carried out at a drying temperature lower than 100° C.

15. The method according to claim 5, further comprising the step of manufacturing electronic components and devices by disposing the functional product on a flexible substrate.

16. The method according to claim 15, wherein said electronic components and devices are: electrical connectors and/or electrical wiring; electric welders; materials and coatings for heat exchangers; electric heaters; anti-electrostatic materials and coatings; flame retardants; magnetoresistive sensors; electromechanical relays/reed relays; circuit breakers; or electromechanical actuators.

17. The functional product according to claim 1, wherein the first component is graphene flake powder.

18. The functional product according to claim 17, wherein the second component is $Fe_3O_4$.

* * * * *